US009379728B1

United States Patent
Singh et al.

(10) Patent No.: US 9,379,728 B1
(45) Date of Patent: Jun. 28, 2016

(54) SELF-CALIBRATED DIGITAL-TO-ANALOG CONVERTER

(71) Applicant: STMicroelectronics International N.V., Amsterdam (NL)

(72) Inventors: Pratap Narayan Singh, Chahania Chandauli (IN); Shiva Sharath Babu Kaleru, Karimnagar (IN); Ankur Bal, Greater Noida (IN); Mohit Singh, Delhi (IN); Rakesh Malik, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/751,456

(22) Filed: Jun. 26, 2015

(51) Int. Cl.
*H03M 1/10* (2006.01)
*H03M 1/74* (2006.01)

(52) U.S. Cl.
CPC ............ *H03M 1/1023* (2013.01); *H03M 1/747* (2013.01)

(58) Field of Classification Search
CPC ......... H03M 1/08; H03M 1/66; H03M 1/662; H03M 1/687; H03M 1/0678; H03M 1/1061; H03M 1/0863; H03M 1/1004; H03M 1/742; H03M 3/504; H03M 1/747; H03M 1/1023; H03F 3/00; H03F 3/68; H03F 3/45; H03F 3/187; H03F 3/387
USPC ................. 341/120, 121, 144, 145, 146, 147; 327/276; 330/252, 296, 103
See application file for complete search history.

(56) References Cited

U.S. PATENT DOCUMENTS

| 4,272,760 | A  | * | 6/1981  | Prazak    | H03M 1/00 341/120   |
| 6,130,632 | A  | * | 10/2000 | Opris     | H03M 1/1061 341/120 |
| 6,191,715 | B1 | * | 2/2001  | Fowers    | H03M 3/388 341/120  |
| 7,466,252 | B1 | * | 12/2008 | Radulov   | H03M 1/1061 341/120 |
| 7,893,856 | B2 | * | 2/2011  | Ek        | H03M 1/0678 341/144 |
| 7,920,005 | B2 | * | 4/2011  | Yazicioglu | A61B 5/0428 327/276 |
| 8,125,361 | B2 |   | 2/2012  | Choe et al. | |
| 2013/0027235 | A1 | * | 1/2013 | Riches    | H03M 1/1004 341/120 |

OTHER PUBLICATIONS

Tseng, Wei-Hsin, et al: "A 12-Bit 1.25-GS/s DAC in 90 nm CMOS With >70 dB SFDR up to 500 MHz," IEEE Journal of Solid-State Circuits, vol. 46, No. 12, Dec. 2011, pp. 2845-2856.
Tseng, Wei-Hsin, et al: A 12b 1.25GS/s DAC in 90nm CMOS with >70dB SFDR up to 500MHz, ISSCC 2011 / Session 10 / NYQE Cut-Rate Converters / 10.7, pp. 192-194.
Engel, Gil et al: "A 14b 3/6GHz Current-Steering RF DAC in 0.18 μm CMOS with 66dB ACLR at 2.9GHz," ISSCC 2012 / Session 27 / Data Converter Techniques / 27.1, pp. 458-460.

(Continued)

*Primary Examiner* — Lam T Mai
(74) *Attorney, Agent, or Firm* — Gardere Wynne Sewell LLP (57) ABSTRACT

A digital-to-analog converter has an output. An analog-to-digital converter senses a voltage at the output of the digital-to-analog converter and generates a digital voltage signal. A source mismatch estimator processes the digital voltage signal to output an error signal indicative of current source mismatch within the digital-to-analog converter. An error code generator generates a digital calibration signal from the error signal. The digital calibration signal is converted by a redundancy digital-to-analog converter to an analog compensation signal for application to the output of analog-to-digital converter to nullify effects of the current source mismatch.

24 Claims, 7 Drawing Sheets

(56) References Cited

OTHER PUBLICATIONS

Lin, Wei-Te, et al: "A 12b 1.6GS/s 40mW DAC in 40nm CMOS with 70dB SFDR over Entire Nyquist Bandwidth," ISSCC 2013 / Session 26 / High-Speed Data Converters / 26.7, pp. 474-476.

Van De Vel, Hans, et al: "A 240mW 16b 3.2GS/s DAC in 65 nm CMOS with >-80dBc IM3 up to 600MHz," ISSCC 2014 / Session 11 / Data Converter Techniques / 11.7, pp. 206-208.

Brandt, Brian, et al: "A 14b 4.6GS/s RF DAC in 0.18 μm CMOS for Cable Head-End Systems," ISSCC 2014 / Sessin 22 / High-Speed Data Converters / 22.7, pp. 390-392.

\* cited by examiner

SELF-CALIBRATED DIGITAL-TO-ANALOG CONVERTER

TECHNICAL FIELD

The present invention relates to digital-to-analog converter (DAC) circuits and, in particular, to the calibration of a digital-to-analog converter.

BACKGROUND

High frequency digital-to-analog converters (DAC) are essential components for modern communication systems like DOCSIS, WiHD, etc. Indeed, DAC performance requirements are increasing with each new generation of these modern standards.

More particularly for high speed and high resolution applications, current steering DACs are preferred. A current steering DAC works by applying a digital data sequence on a clock edge to control or steer the current between two branches of an output differential pair of transistors. As a result, a current proportional to the input digital sequence is produced and passed through differential load resistors to generate the analog output voltage. This current steering process involves a current source coupled with plurality of transistor switches connecting to the output. Current delivered to the output is determined by the current source and mismatch of the current steering switches.

For the design of current steering digital to analog converters there are three major components which dominate the performance of the converter: a) the accuracy of weights of the current sources because each one represents a binary or thermometric weight corresponding to the input bit of the binary sequence; b) the total parasitic capacitance at key nodes in the current signal path and c) control signal timing mismatch and inter symbol interference because not every switch is toggled on each clock transition (this makes the output voltage sensitive to the frequency of the output signal and results in distortion at high output frequency). The weight accuracy concern is responsible for the static or DC performance of the DAC design. The parasitic capacitance concern is responsible for high frequency performance of the DAC.

Current source mismatch error is reduced by increasing the area of transistor used to make the current source. However, there is a tradeoff for increasing the area of the transistor in that node capacitance is also proportionally increased. As a result, high frequency performance is reduced when using larger transistors as current sources. There is accordingly a need to minimize the area occupied by the current source in current steering implementations so as to reduce parasitic capacitance for good high frequency performance. However, the reduction of the area of the current source increases a resultant mismatch with the switching transistors used for current steering, this factor becoming a more dominant component affecting accuracy of the current source.

There is also an issue related to inter-symbol interference in this kind of architecture as all binary current sources will not switch every time so some capacitive nodes need time to settle and some unsettled nodes have memory effect resulting in dynamic performance degradation. To improve the dynamic performance of the DAC and to eliminate inter-symbol interference, two pairs of switches are instead used for current steering. This type of DAC circuit configuration is referred to in the art as a quad switch circuit. The design of the quad switch configuration ensures that there is some switching at every clock cycle for all capacitive nodes and hence all nodes show a same behavior at all output frequencies. However, quad switches have some mismatch and they introduce different voltages at the nodes when switched on. Since the current sources are now small transistors, these devices see change in drain to source voltages and hence the current changes during each clock phase degrading the static performance.

Calibration of the current source and included switch transistors is accordingly needed.

Digital-to-analog converters are well known circuits in the art. The following references illustrate and describe examples of current state-of-the-art digital-to-analog converters:

W. Tseng, et. al. "A 12b 1.25 GS/s DAC in 90 nm CMOS with >70 dB SFDR up to 500 MHz" ISSCC2011;

Gil Engel, et. al., "A 14b 3/6 GHz Current-Steering RF DAC in 0.18 µm CMOS with 66 dB ACLR at 2.9 GHz" ISSCC2012;

W. Lin, et. al., "A 12b 1.6 GS/s 40 mW DAC in 40 nm CMOS with >70 dB SFDR over Entire Nyquist Bandwidth" ISSCC2013;

Brian Brandt, et. al., "A 14b 4.6 GS/s RF DAC in 0.18 µm CMOS for Cable Head-End Systems" ISSCC2014;

Hans Van de Vel, et. al., "A 240 mW 16b 3.2 GS/s DAC in 65 nm CMOS with <−80 dBc IM3 up to 600 MHz" ISSCC2014; and U.S. Pat. No. 8,125,361.

The disclosures of these references are incorporated by reference.

SUMMARY

An embodiment concerns the performance of a calibration operation in a digital-to-analog converter (DAC) for addressing static errors of the current sources and quad switches used in a current steering implementation. An analog-to-digital converter samples the DAC output, with the digital samples processed by digital calibration logic in a digitally controlled closed loop configuration to generate error correction codes for each clock phase. A redundant DAC running at double rate converts these error correction codes to corresponding analog voltages that are applied to the DAC output in two different phases in order to correct for mismatches.

In an embodiment, a circuit comprises: a plurality of current source cells coupled to an output and each configured to generate an output current in response to digital-to-analog conversion of digital data, a sum of said output currents producing an output voltage; and a calibration circuit. The calibration circuit comprises: a training code generator configured to generate first and second training codes for application to the plurality of current source cells as said digital data, the first and second training codes configured to isolate a selected one of the current source cells (and its corresponding quad switch pair, in an example implementation); an analog-to-digital converter configured to the sample the output voltage in response to each of the first and second training codes and generate corresponding first and second digital voltage signals; a source mismatch circuit configured to determine a difference between the first and second digital voltage signals, said difference being indicative of current source (and switch) mismatch in the selected one of the current source cells; an error code generator configured to generate a digital calibration signal in response to said difference; and a redundancy digital-to-analog converter configured to convert the digital calibration signal to an analog compensation signal for application to said output.

In an embodiment, a circuit comprises: an analog-to-digital converter configured to sense a voltage at an output of a digital-to-analog converter and generate a digital voltage signal; a source mismatch estimator configured to process the digital voltage signal to output an error signal indicative of current source (and included switch) mismatch within the digital-to-analog converter; an error code generator configured to process the error signal and generate a digital calibration signal; and a redundancy digital-to-analog converter configured to convert the digital calibration signal to an analog compensation signal for application to the output of analog-to-digital converter to nullify effects of the current source mismatch.

In an embodiment, a method comprises: generating an output current at each one of a plurality of current source cells coupled to an output in response to analog-to-digital conversion of digital data, a sum of said output currents producing an output voltage; and performing a calibration. The calibration comprises: generating first and second training codes for application to the plurality of current source cells as said digital data, the first and second training codes configured to isolate a selected one of the current source cells (and its corresponding quad switch pair, in an example implementation); converting the output voltage in response to each of the first and second training codes to generate corresponding first and second digital voltage signals; calculating a difference between the first and second digital voltage signals, said difference being indicative of current source (and switch) mismatch in the selected one of the current source cells; generating a digital calibration signal in response to said difference; and converting the digital calibration signal to an analog compensation signal for application to said output.

In an embodiment, a method comprises: sensing a voltage at an output of a digital-to-analog converter; converting the sensed voltage to generate a digital voltage signal; processing the digital voltage signal to generate an error signal indicative of current source (and switch) mismatch within the digital-to-analog converter; processing the error signal to generate a digital calibration signal; converting the digital calibration signal to an analog compensation signal; and applying the analog compensation signal the output of analog-to-digital converter to nullify effects of the current source mismatch.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
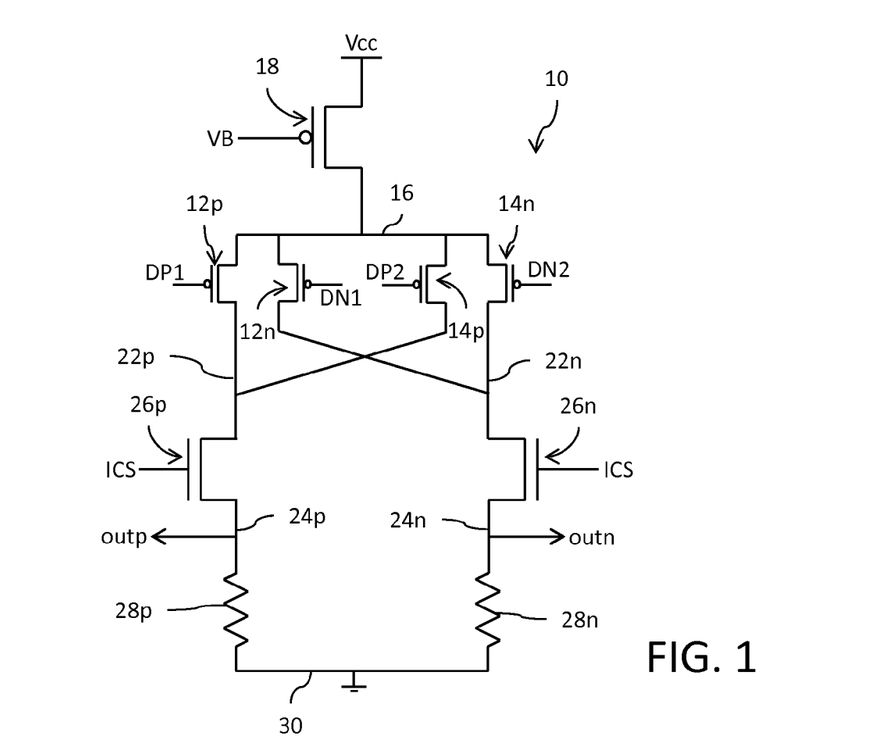
FIG. 1 is a circuit diagram for a quad switch circuit configuration.

Reference is now made to FIG. 1 which illustrates a circuit diagram for a quad switch circuit 10 configuration. The circuit 10 includes a first pair of transistor switches 12p and 12n and a second pair of transistor switches 14p and 14n. The gate terminals of the first pair of transistor switches 12p and 12n are configured to receive control signals DP1 and DN1, respectively. The gate terminals of the second pair of transistor switches 14p and 14n are configured to receive control signals DP2 and DN2, respectively. The source terminals of the first and second pairs of transistor switches are connected together at a common node 16. A current source transistor 18 is coupled between the common node 16 and a first reference supply node 20 (Vcc). A bias voltage VB is applied to the gate terminal of transistor 18. The drain terminals of the transistor switches 12p and 14p are connected at node 22p. An isolation transistor 26p is coupled between node 22p and a first output node 24p. A first load resistor 28p is coupled between the first output node 24p (outp) and a second reference supply node 30 (ground). The drain terminals of the transistor switches 10n and 12n are connected at node 22n. An isolation transistor 26n is coupled between node 22n and a second output node 24n (outn). A second load resistor 28n is coupled between the second output node 24n and the second reference supply node 30. An isolation control signal ICS may be applied to the gate terminals of the transistors 26p and 26n to isolate the output nodes from the steered currents.

Figure 2:
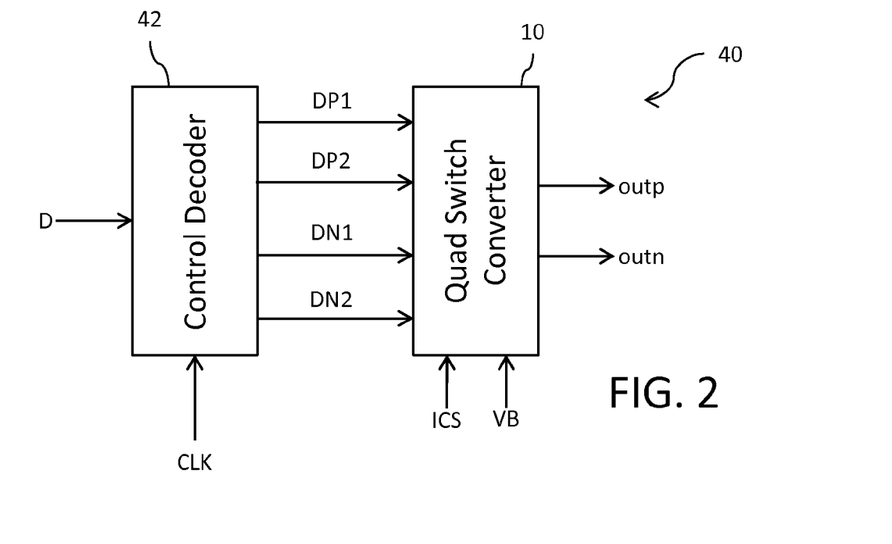
FIG. 2 is a block diagram of a current source cell circuit using the quad switch circuits of FIG. 1.

The quad switch circuit 10 forms a functional current steering component of a current source cell circuit 40 as shown in FIG. 2. A control decoder circuit 42 receives a data signal D and a clock signal CLK, and functions to generate the control signals DP1, DP2, DN1 and DN2 for controlling current steering through the quad switch circuit 10 for application of current to the load resistances in accordance with the logic value of the data signal.

Figure 3:
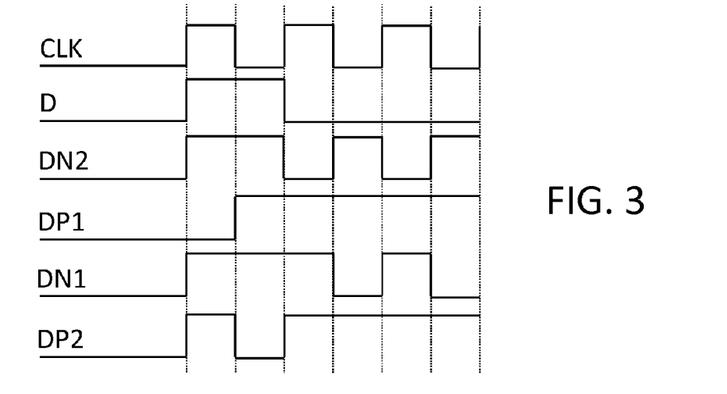
FIG. 3 shows operational waveforms for the current source cell circuit of FIG. 2.

Operation of the current source cell circuit 40 may be better understood through reference to an example. Consider the single bit data signal D having a logic value of "1" in a first cycle of the clock signal, a logic value of "0" in a second cycle of the clock signal, and a logic value of "0" in a third cycle of the clock signal. FIG. 3 shows operational waveforms for the operation of the control decoder circuit 42 to generate the control signals DP1, DP2, DN1 and DN2 in the digital-to-analog conversion of the single bit data signal D over those clock cycles. The control decoder circuit 42 decodes the bit value of logic "1" bit for the signal D in a first (for example, positive) phase of the first cycle of the clock signal to generate the following control signal logic: DN2=logic "1", DP1=logic "0"; DN1=logic "1" and DP2=logic "1." Applied to the quad switch circuit 10, these control signals will turn on only transistor switch 12p and a first current from current source transistor 18 will be steered through resistor 28p to develop a voltage at the output node outp indicative of the logic "1" value of the signal D in the first clock cycle. In a second (for example, negative) phase of the first cycle of the clock signal, the bit value of logic "1" for signal D is decoded to generate the following control signal logic: DN2=logic "1", DP1=logic "1"; DN1=logic "1" and DP2=logic "0." Applied to the quad switch circuit 10, these control signals will turn on only transistor switch 14p and a second current from current source transistor 18 will be steered through resistor 28p to develop a voltage at the output node outp indicative of the logic "1" value of the signal D in the first clock cycle. The control decoder circuit 42 then decodes the logic value of "0" for the signal D in the positive phase of the second cycle of the clock signal to generate the following control signal logic: DN2=logic "0", DP1=logic "1"; DN1=logic "1" and DP2=logic "1." Applied to the quad switch circuit 10, these control signals will turn on only transistor switch 12n and a third current from current source transistor 18 will be steered through resistor 28*n* to develop a voltage at the output node outn indicative of the logic "0" value of the signal D in the first clock cycle. In the negative phase of the second cycle of the clock signal, the logic value "0" for the signal D is decoded to generate the following control signal logic: DN2=logic "1", DP1=logic "1"; DN1=logic "0" and DP2=logic "1." Applied to the quad switch circuit 10, these control signals will turn on only transistor switch 14*n* and a fourth current from current source transistor 18 will be steered through resistor 28*n* to develop a voltage at the output node outn indicative of the logic "0" value of the signal D in the second clock cycle. The same decode, control signal generation and current steering actions occur in the third cycle of the clock signal for the logic value "0" for the signal D.

What will be noted from the foregoing operational example is that in each given clock cycle, the quad switch circuit 10 is controlled to steer current from the current source 18 through a same load resistor dependent on the logic value of the signal D but which passes through two different switching transistors (in different switch pairs) in consecutive phases of the same clock cycle. As the size of the current source 18 is reduced, mismatch between the switching transistors can significantly contribute to error in the output analog voltage developed across each load resistor. The reason for this is that the magnitudes of the steered currents through the switches may be different and thus the developed voltages across the load resistors will correspondingly be different for the different logic values of the signal D. Put another way, for D=logic "1" the magnitudes of the first and second currents steered through resistor 28*p* may be different by a value equal to AI from the magnitudes of the third and fourth currents steered through resistor 28*n* for D=logic "0." This mismatch error AI will introduce error adversely affecting the linearity of the DAC operation.

Figure 4:
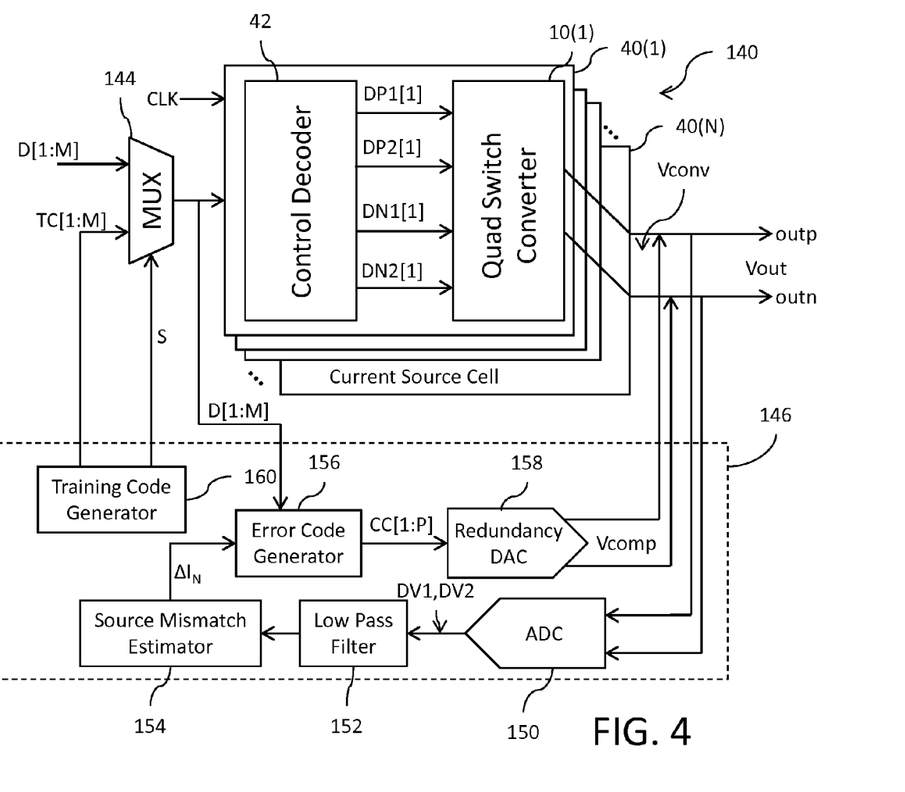
FIG. 4 is a block diagram of a digital-to-analog converter circuit with self-calibration.

Reference is now made to FIG. 4 which illustrates a block diagram of a digital-to-analog conversion circuit 140 with self-calibration. The circuit 140 includes a plurality (N) of current source cell circuits 40(1)-40(N). Each current source cell circuit 40 has a configuration as shown in FIG. 2. The first output nodes 24*p* for the quad switch circuits 10(1)-10(N) within the current source cell circuits 40 are connected together to form the first output node (outp). Likewise, the second output nodes 24*n* for the quad switch circuits 10(1)-10(N) within the current source cell circuits 40 are connected together to form the second output node (outn). Corresponding control signals DP1[1:N], DP2[1:N], DN1[1:N] and DN2[1:N] control current steering through each of the quad switch circuits 10(1)-10(N) for application of current to the load resistances and the generation of output voltages (Vconv) on the differential output nodes outp and outn. The control signals DP1[1:N], DP2[1:N], DN1[1:N] and DN2[1:N] are generated by the control decoder circuits 42 that receive a clock signal CLK and decode a corresponding bit of a multi-bit data signal D[1:M]. The multi-bit data signal D[1:M] is selectively passed by a multiplexer (MUX) circuit 144 in response to deassertion of a select signal S for operation of the circuitry in digital-to-analog conversion mode. In an implementation, M=N. In another implementation, M<N in which case the circuit 140 may further include a data decoder for at least some bits of the multi-bit data signal D[1:M] and a delay equalizer for any bits which are not decoded (see, for example, FIG. 10 discussed herein).

As discussed above, mismatch error AI within each quad switch circuits 10(1)-10(N) will introduce error that adversely affects the linearity of the DAC operation in converting the digital multi-bit data signal D[1:M] to an analog output voltage at the differential output nodes outp and outn. To address and correct for these mismatch errors AI, the circuit 140 further includes a calibration system 146. The calibration system 146 operates to isolate individual ones of the quad switch circuits 10(1)-10(N) within the plurality of current source cell circuits 40 and sample the output voltages from that isolated quad switch circuit 10 in response conversion of different logic values of the signal D. If the sampled output voltages are different, in either or both consecutive phases of one clock cycle or over consecutive clock cycles, then a current source mismatch error AI is present in that isolated quad switch circuit 10. The calibration system 146 responds to the mismatch errors present across the quad switch circuits 10(1)-10(N) by generating an analog compensation voltage Vcomp which is applied to the differential output nodes outp and outn to counteract against the mismatch errors.

Isolation of individual ones of the current source cell circuits 40 and the quad switch circuits 10(1)-10(N) therein is accomplished by processing a series of multi-bit training codes TC[1:M] through the current source cell circuits 40 of the digital-to-analog conversion circuit 140. The training codes TC are generated specifically for calibration by a training code generator 160. The select signal S is asserted when the digital-to-analog conversion circuit 140 is configured for operation in a calibration mode. The MUX circuit 144 responds to the asserted select signal by passing each training code TC[1:M] to the plurality of current source cell circuits 40. The control decoder circuits 42 function to decode each bit of the received training code TC[1:M] and assert corresponding sets of control signals DP1[1:N], DP2[1:N], DN1[1:N] and DN2[1:N]. The series of training codes TC[1:M] generated by the training code generator 160 are specifically designed so that only one of the quad switch circuits 10(1)-10(N), the isolated quad switch circuit, will respond to different logic values of the signal D in consecutive clock cycles for two consecutively passed training codes.

Consider, for example, the following simplification: assume four current source cell circuits 40(1)-40(4) with four corresponding quad switch circuits 10(1)-10(4). The first training code may comprise a data signal <0010> while the second training code may comprise a data signal <0000>. The first, second and fourth quad switch circuits 10(1), 10(2) and 10(4) (for the first, second and fourth current source cell circuits 40) will receive the same logic values of the signal D (i.e., logic "0") in each of a first and second clock cycles processing the two training codes. The third quad switch circuit 10(3) for the third current source cell circuit 40(3), in this case the isolated source cell circuit and quad switch circuit, however, will receive different logic values of the signal D in consecutive clock cycles. The current contributions from the first, second and fourth quad switch circuits 10(1), 10(2) and 10(4) will be identical in each of the consecutive clock cycles. However, the current contributions from the isolated third quad switch circuit 10(3) in the third current source cell circuit 40(3) may be different in the consecutive clock cycles if there is current source mismatch. If the difference between the overall current contributions can be obtained (i.e., the difference in output Vconv), then the current contributions from the first, second and fourth quad switch circuits 10(1), 10(2) and 10(4) are cancelled out by the difference calculation, thus leaving only the difference current contributions associated with the isolated third quad switch circuit 10(3) itself and attributable to any current source mismatch within that isolated third quad switch circuit 10(3).

By selecting the plurality of the training codes, each of the current source cell circuits 40 and their associated quad switch circuits 10 can be selectively isolated and a determination made as to the current source mismatch for each quad switch circuit in each phase of the clock cycle. The set of current source mismatches identified for the training code data may then be processed to determine a data dependent compensation voltage (Vcomp) for application at the outputs outp and outn when converting the digital data to counteract the mismatch and generate a calibrated output voltage (Vout).

The calibration system 146 includes an analog-to-digital converter circuit 150 that has an input coupled to sample the analog output voltage (Vconv) generated by the plurality of quad switch circuits 10(1)-10(N) in response to an applied data signal in each phase over two consecutive clock cycles. The connection of the analog-to-digital converter circuit 150 input is made to both the first output node 24p and the second output node 24n with the analog-to-digital converter circuit 150 operating in differential input mode to obtain the voltage across the load resistors of the quad switch circuits 10(1)-10(N). The sampled analog output voltage is converted by the analog-to-digital converter circuit 150 to a digital value and passed through a digital low pass filter 152.

With reference once again to the use of training codes TC[1:M], the select signal S is asserted in calibration mode and the MUX circuit 144 passes the first and second training codes selected by the training code generator 160 in consecutive clock cycles to isolate a particular one of the current source cell circuits 40 and its associated quad switch circuit 10(1)-10(N). The analog-to-digital converter circuit 150 samples the analog output voltage from the quad switch circuits 10(1)-10(N) in response to the first training code during both phases of a first clock cycle. A corresponding first digital voltage value DV1 is output and low pass filtered. The analog-to-digital converter circuit 150 next samples the analog output voltage from the quad switch circuits 10(1)-10(N) in response to the second training code during both phases of a second clock cycle. A corresponding second digital voltage value DV2 is output and low pass filtered.

The filtered first and second digital voltage values DV1 and DV2 are then processed by a source mismatch estimator 154. The source mismatch estimator 154 functions to calculate the difference between the overall current contributions of the quad switch circuit 10 isolated by the first and second training codes and identify, from the first and second digital voltage values, the current source mismatch (i.e., the mismatch error $\Delta I_N$) associated with that isolated quad switch circuit 10 in each phase.

The process is then repeated using different sets of training codes designed to isolate different ones of the quad switch circuits 10(1)-10(N). Each repetition generates another current source mismatch error for a particular isolated one of the quad switch circuits 10. The isolation, voltage measurement and mismatch calculation operations are performed as many times as desired to obtain mismatch data AI useful in characterizing the overall response of the digital-to-analog converter 140.

After processing of the different sets of training codes is completed, the select signal S is deasserted and operation of the digital-to-analog conversion circuit 140 transitions to digital-to-analog conversion mode. The MUX 144 now passes the digital multi-bit data signal D[1:M]. An error code generator 156 processes the signal D[1:M] and the current source mismatch data ($\Delta I_N$ for the N quad switch circuits 10) to generate a digital calibration code CC[1:P] for correcting the source current mismatch in each phase of the clock signal. It will be noted that not all M bits of the signal D[1:M] need be considered in generating the digital calibration code CC[1:P] using the mismatch data AI. The digital calibration code CC[1:P] in each clock cycle is accordingly dependent on the signal D[1:M] in that clock cycle as well as the current source mismatch data ($\Delta I_N$ for the N quad switch circuits 10) previously collected during calibration mode.

A redundancy digital-to-analog converter circuit 158 then converts the digital calibration code CC[1:P] to an analog compensation voltage (Vcomp) which is differentially added to the analog output voltage (Vconv) from the quad switch circuit 10 at outputs outp and outn in each phase of the clock signal to produce the calibrated output voltage Vout. In an embodiment, P<N. In another embodiment, P=N. The redundancy digital-to-analog converter circuit 158 is accordingly digitally controlled by the digital calibration code CC[1:P] to counteract the cumulative mismatch error. The compensation voltage Vcomp that is produced is of the same magnitude as the mismatch error, but of opposite sign during both phases of the clock signal so as to nullify the mismatch.

Figures 5A, 5B:
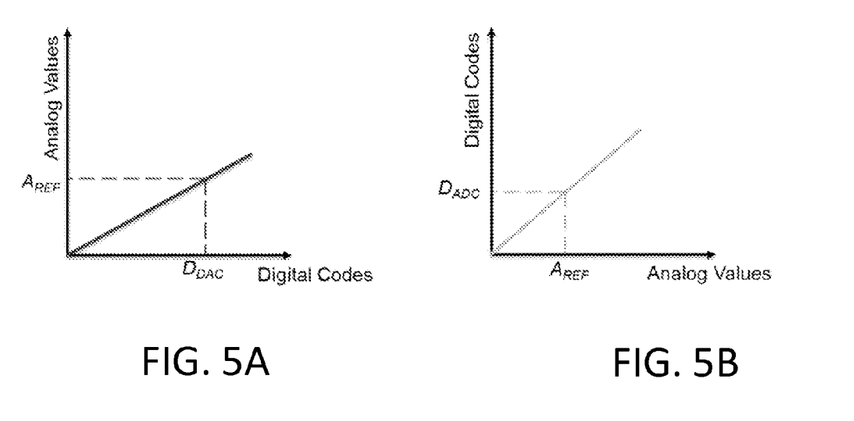
FIGS. 5A-5D illustrate a process technique for gain rotation.
Figure 5C:
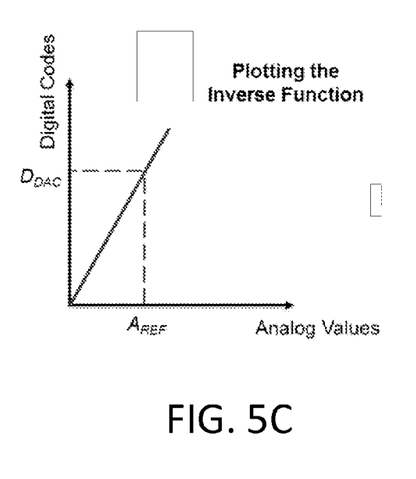
Figure 5D:
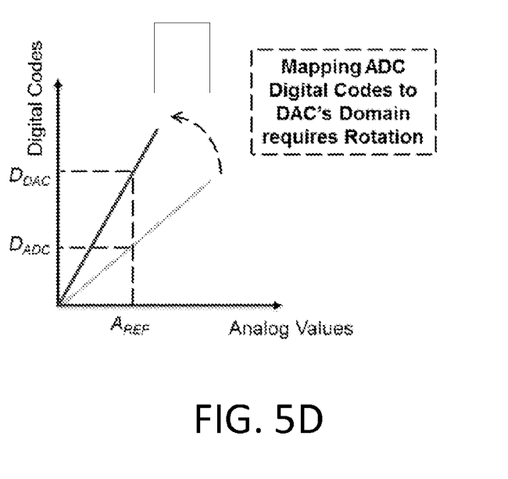

The operation for calculating the digital calibration code CC[1:P] includes an accounting for offset correction. In addition to offset correction, the operation further includes a gain rotation step that is performed by the error code generator 156 in order to align the digital code mappings of the analog-to-digital converter circuit 140 (formed by the decoder 142 and plurality (N) of quad switch circuits 10(1)-10(N)) for converting the signal D[1:M] and the digital code mappings of the redundancy digital-to-analog converter circuit 158 for converting the digital calibration code CC[1:P]. This process is depicted in FIGS. 5A-5D. FIG. 5A shows the ideal response of the analog-to-digital converter circuit 140. FIG. 5B shows the ideal response of the redundancy digital-to-analog converter circuit 158. FIG. 5C shows the inverse of the ideal response of the analog-to-digital converter circuit 140. FIG. 5D shows the required gain rotation for aligning the digital codes.

Figure 6:
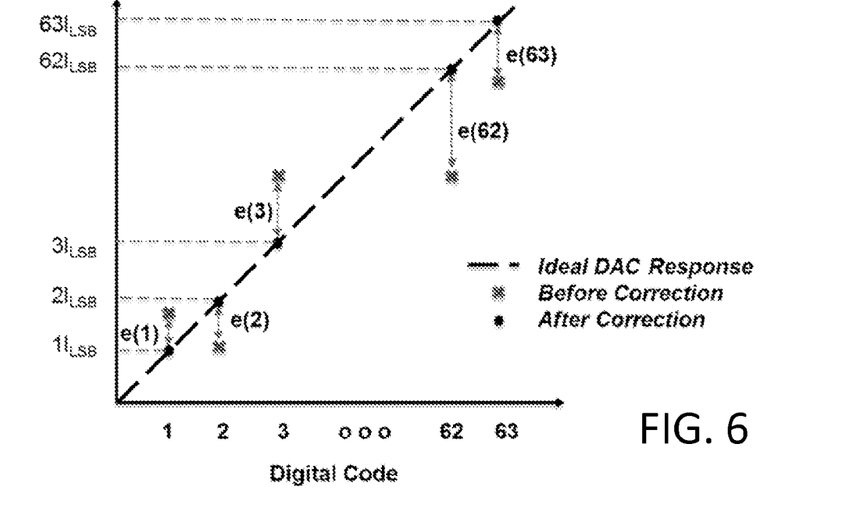
FIG. 6 illustrates operation for calibration correction of the DAC.

Reference is now made to FIG. 6 which illustrates the calibration correction performed by the calibration system 146 for an example 6-bit digital-to-analog converter circuit 140. The x-axis represents the integer value (0-63) of the digital code for the 6-bit signal D. The y-axis represents the current generated by the plurality of quad switch circuits 10 in response to each code value. The dotted diagonal line plots the ideal linear response of the digital-to-analog converter circuit 140. The "x" marks indicated the actual output current for each code value associated with the sample voltage measurements (i.e., Vconv). The errors e(0)-e(63) identify the mismatch error $\Delta I_N$ determined by the calibration system 146. The "•" marks the corrected output of the digital-to-analog converter circuit 140 in response to the digital calibration code CC[1:P] and the generation of the compensation voltage Vcomp. The function of the compensation voltage Vcomp is to move the actual digital-to-analog converter output (Vconv) towards the ideal response (Vout) by counteracting cumulative mismatch error in the operation of the plurality of quad switch circuits 10.

Figure 7A:
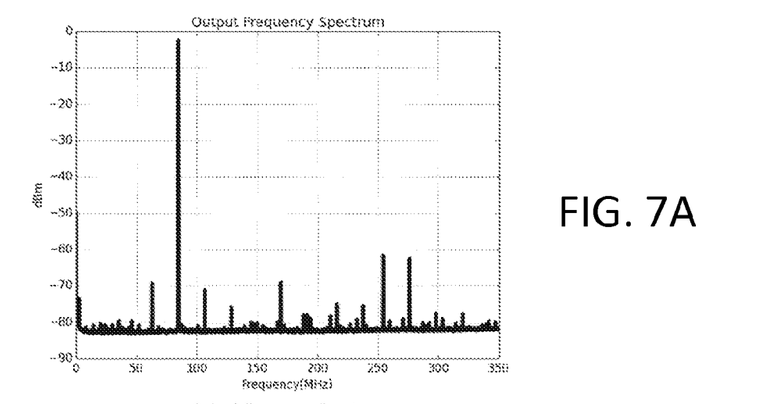
FIGS. 7A, 8A, and 9A illustrate output frequency spectra of the digital-to-analog converter before calibration.
Figure 7B:
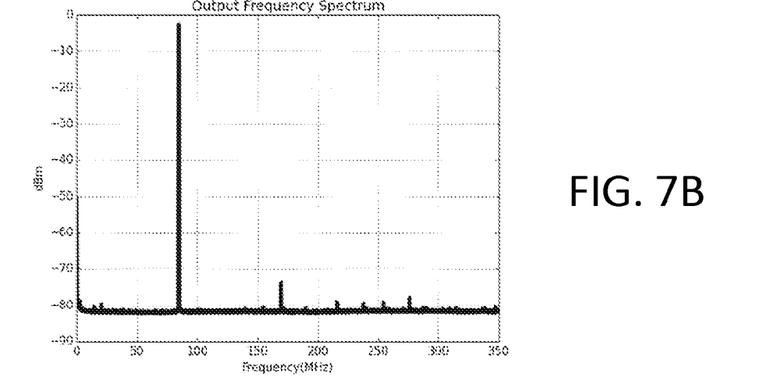
FIGS. 7B, 8B, and 9B illustrate output frequency spectra of the digital-to-analog converter after calibration.

The output frequency spectrum of an example of the digital-to-analog converter 140 without operation of the calibration system 146 is shown in FIG. 7A. The output frequency spectrum of the digital-to-analog converter 140 with operation of the calibration system 146 is shown in FIG. 7B. A greater than 12 dB improvement is achieved. This concerns dynamic performance with 700 Msps at a 84 MHz output.

Figure 8A:
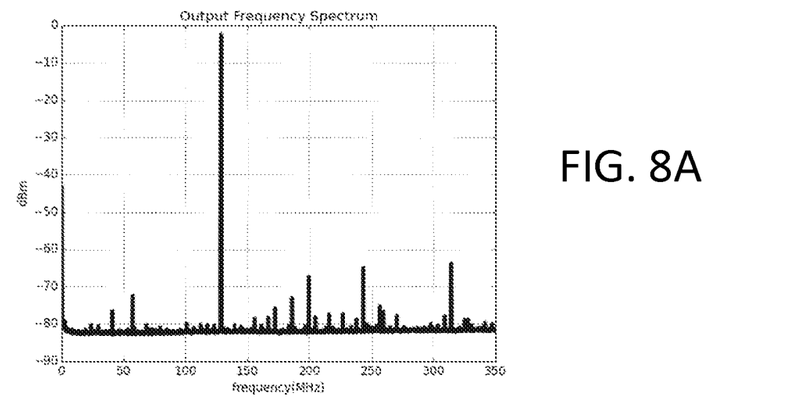
Figure 8B:
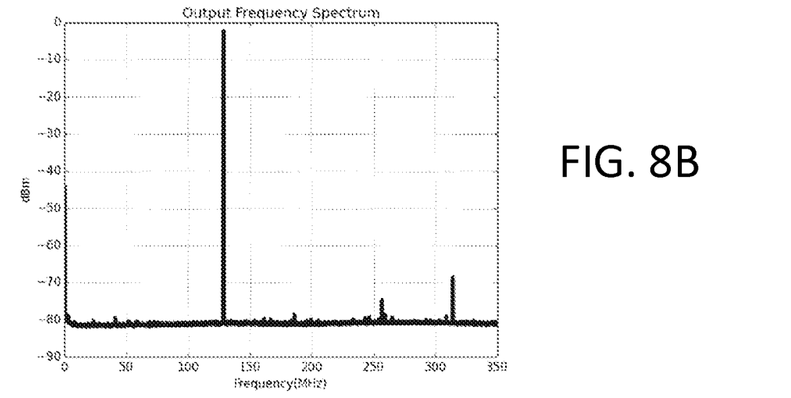

The output frequency spectrum of an example of the digital-to-analog converter without operation of the calibration system 146 is shown in FIG. 8A. The output frequency spectrum of the digital-to-analog converter with operation of the calibration system 146 is shown in FIG. 8B. A greater than 6 dB improvement is achieved. This concerns dynamic performance with 700 Msps at a 128 MHz output.

Figure 9A:
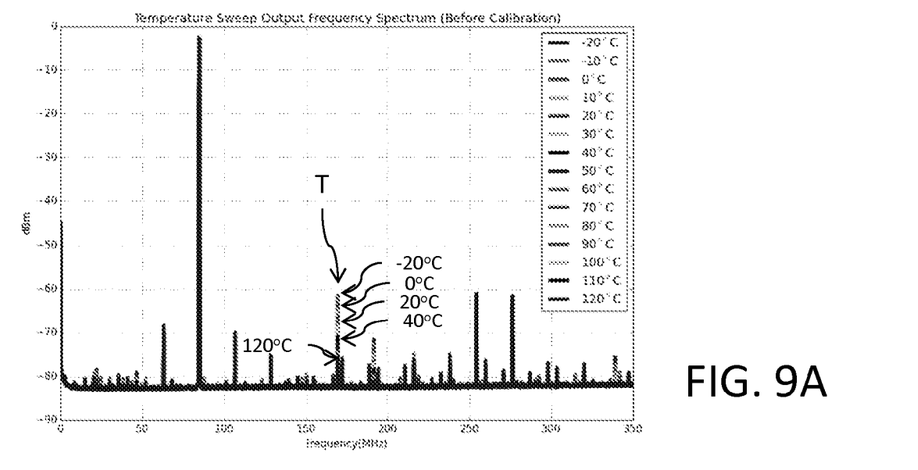
Figure 9B:
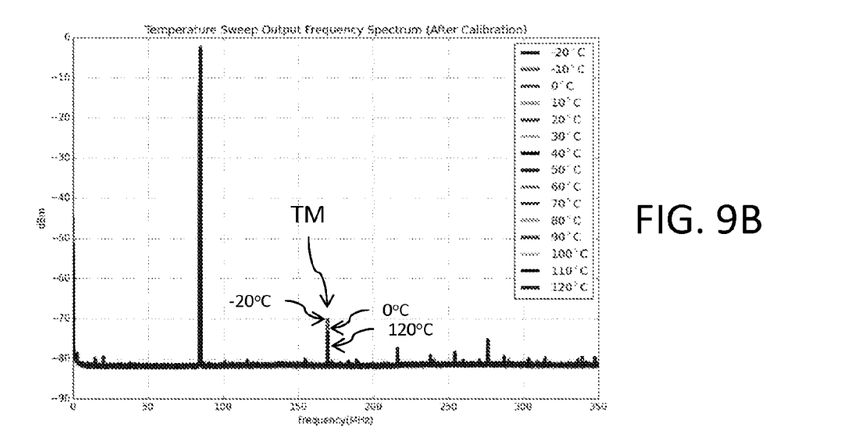

Operation of the system in response to a temperature change is also an important consideration. Temperature measurement from −20° C. to 125° C. at 10° C. increments was made. The output frequency spectrum of an example of the digital-to-analog converter 140 in the presence of the temperature sweep without operation of the calibration system 146 is shown in FIG. 9A. The temperature impact is shown at "T". The output frequency spectrum of the digital-to-analog converter in the presence of the temperature sweep with operation of the calibration system 146 is shown in FIG. 9B. The minimization of the temperature impact is shown at "TM".

Figure 10:
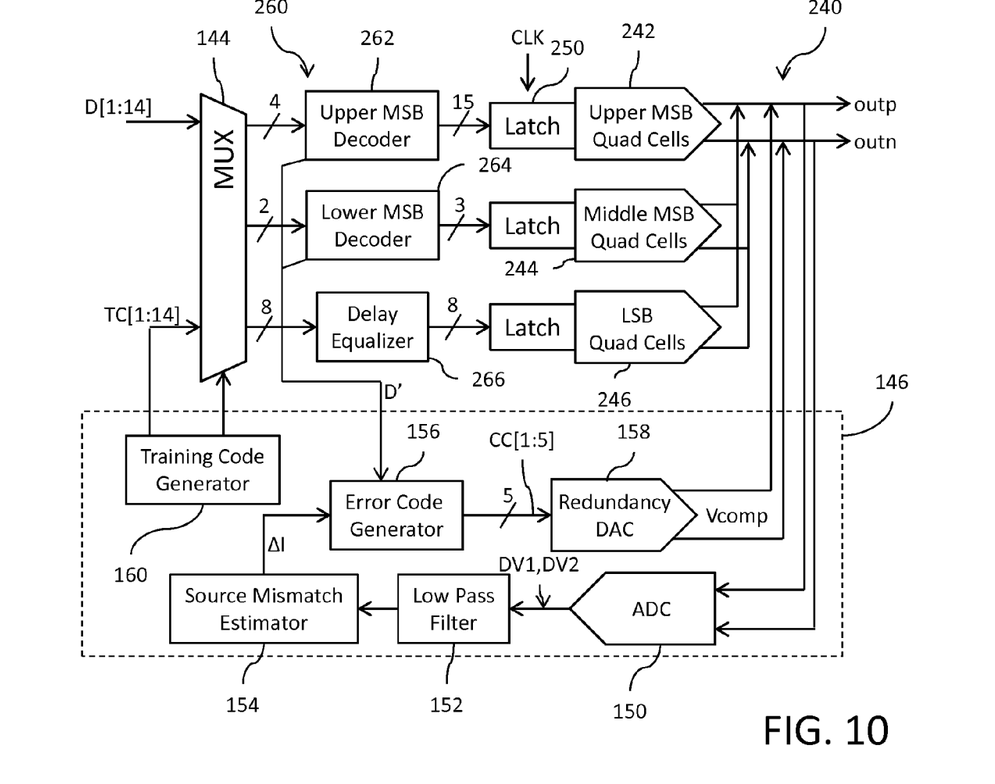
FIG. 10 is a block diagram of a digital-to-analog converter circuit with self-calibration.

Reference is now made to FIG. 10 which illustrates a block diagram of a digital-to-analog conversion circuit 240 with self-calibration. Like reference numbers refer to like or similar parts as shown in FIG. 4 and described above. The circuit 240 illustrates a more specific implementation of the circuit 140 of FIG. 4. The plurality of current source cell circuits 40 (each including a quad switch circuit 10) are arranged in groups including: a set 242 of fifteen upper most significant bit (MSB) current source cells; a set 244 of three lower MSB current source cells; and a set 246 of eight least significant bit (LSB) current source cells. The differential outputs of the quad switch circuits 10 across the sets 242, 244 and 246 are respectively connected to each other to form outputs outp and outn. Each set 242, 244 and 246 includes an associated multi-bit latch circuit 250 configured to latch data in response to the clock signal CLK, with that data converted as discussed above to generate the appropriate control signals DP1, DP2, DN1 and DN2 in each current source cell circuits 40 for controlling current steering by the quad switch circuit 10 (see, FIGS. 2-3).

The digital-to-analog conversion circuit 240 further includes a data decoder circuit 250. In this implementation, N>M (N=26 and M=14), so the data decoder functions to decode the M bits of the multi-bit data signal D[1:M] and the M bits of the training code TC[1:M] to generate a twenty-six bit data signal for the conversion. The data decoder circuit 260 includes an upper MSB decoder 262 (decoding 4:15) and a lower MSB decoder 264 (decoding 2:3). Because the LSB portion is not decoded in this implementation, thus passing the 8 LSB through, the data decoder circuit 260 further includes a delay equalizer circuit 266 to ensure that data is substantially synchronously made available to the latch circuits 250. It will be understood that in other implementations, the LSB portion could also be decoded.

The calibration system 146 includes an analog-to-digital converter circuit 150 that has an input coupled to sample the analog output voltage from the plurality of quad switch circuits 10(1)-10(N). The connection of the analog-to-digital converter circuit 150 input is made to both the first output node 24p and the second output node 24n with the analog-to-digital converter circuit 150 operating in differential input mode to obtain the voltage across the load resistors of the quad switch circuits 10(1)-10(N). The sampled analog output voltage is converted by the analog-to-digital converter circuit 150 to a digital value and passed through a digital low pass filter 152.

With reference once again to the use of training codes TC[1:M], the select signal S is asserted in calibration mode and the MUX circuit 144 passes the first and second training codes selected by the training code generator 160 to isolate a particular one of the current source cells 40 and its associated quad switch circuit 10. The analog-to-digital converter circuit 150 samples the analog output voltage from the quad switch circuits 10(1)-10(N) in response to the first training code during both phases of a first clock cycle. A corresponding first digital voltage value DV1 is output and low pass filtered. The analog-to-digital converter circuit 150 next samples the analog output voltage from the quad switch circuits 10(1)-10(N) in response to the second training code during both phases of a second clock cycle. A corresponding second digital voltage value DV2 is output and low pass filtered.

The filtered first and second digital voltage values DV1 and DV2 are then processed by a source mismatch estimator 154. The source mismatch estimator 154 functions to calculate the difference between the overall current contributions of the quad switch circuit 10 isolated by the first and second training codes and identify, from the first and second digital voltage values, the current source mismatch (i.e., the mismatch error $\Delta I_N$) associated with that isolated quad switch circuit 10.

The process is then repeated using different sets of training codes designed to isolate different ones of the quad switch circuits 10(1)-10(N). Each repetition generates another current source mismatch error for a particular isolated quad switch circuit 10. The isolation, voltage measurement and mismatch calculation is performed as many times as desired to obtain mismatch data useful in characterizing the overall response of the digital-to-analog converter 240.

After processing of the different sets of training codes is completed, the select signal S is deasserted and operation of the digital-to-analog conversion circuit 140 transitions to digital-to-analog conversion mode. The MUX 144 now passes the digital multi-bit data signal D[1:M].

An error code generator 156 processes a subset (D') of the decoded multi-bit data signal D[1:M] (for example, relating to the most significant decoded bits output from decoders 262 and 264) as well as the current source mismatch data ($\Delta I_N$ for the N quad switch circuits 10) to generate a digital calibration code CC[1:5] for correcting the source current mismatch in each phase of the clock signal. This processing involves offset correction and gain rotation as described above.

A redundancy digital-to-analog converter circuit 158 then converts the digital calibration code CC[1:5] to an analog compensation voltage (Vcomp) which is differentially added to the analog output voltage (Vconv) from the current source cell circuits 40 at outputs outp and outn in each phase of the clock signal to generate the compensated output Vout. The redundancy digital-to-analog converter circuit 158 is accordingly digitally controlled by the digital calibration code CC[1:5] to counteract the cumulative mismatch error. The compensation voltage Vcomp that is produced is of the same magnitude as the mismatch error, but of opposite sign during both phases of the clock signal so as to nullify the mismatch. The redundancy digital-to-analog converter circuit 158 may comprise any suitable DAC circuit including a current steering DAC. Digitally, the operation speed at redundancy DAC is at least two times the DACs operational frequency in order counter mismatch errors of both phases. This is achieved digitally by multiplexing cumulative error estimates for both phases.

Figure 11:
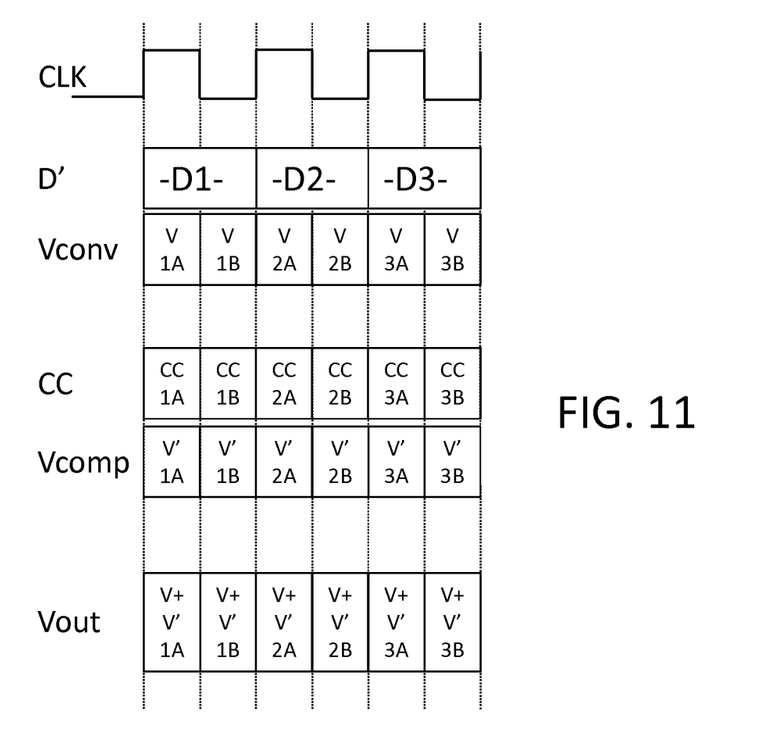
FIG. 11 shows operational waveforms for dual phase redundancy application in the circuit of FIG. 10.

This timing relationship is depicted in FIG. 11 showing for a given data Di the digital-to-analog converter will generate a converted voltage Vconv of ViA in the first phase of the clock cycle and a converted voltage of ViB in the second phase of the clock cycle. The generated digital calibration codes CC[1:5] include a first calibration code CCiA in the first phase of the clock cycle and a second calibration code CCiB in the second phase of the clock cycle. The redundancy digital-to-analog converter circuit 158 generates a converted compensation voltage Vcomp of V'iA in the first phase of the clock cycle (from code CCiA) and a converted voltage of V'iB in the second phase of the clock cycle (from code CCiB). The output voltage Vout at nodes outp and outn is the sum of the V and V' voltages in each clock cycle (e.g., ViA+V'iA in the first phase of the clock cycle and a converted voltage of ViB+V'iB in the second phase of the clock cycle).

It will be understood that the sampling and calibration operation need not be performed with respect to each included quad switch circuit 10. Indeed, it may be sufficient to isolate only those quad switch circuits 10 that are within one of the sets 242-246. In one embodiment, quad switch circuit 10 isolation and associated voltage measurement for calibration is performed only with respect to the current source cell circuits 40 within the set 246 of eight least significant bit (LSB) current source cells. Thus, training for isolation need only be developed and generated by the training code generator with respect to the set 246.

Operation of the system of FIG. 10 with respect to the isolation of a quad switch circuit 10 by training codes and the characterization of mismatch error may be better understood by considering the following:

The mismatch error $\Delta I$ associated with a current source can be characterized as:

$$I_{Non\text{-}Ideal} = I_{Ideal} + \Delta I$$

Wherein: $I_{Non\text{-}Ideal}$ is actual output current and $I_{Ideal}$ is the ideal output current; thus making $\Delta I$ the current mismatch error.

Assume for the DAC design described in connection with FIG. 10 that I is the unit current. Then:

$$I_{LSBk} = 2^{(k-1)} * I, \ k=1 \text{ to } 8 \text{ for the eight } LSB$$

$$I_{LMSBj} = 256 * I, \ j=1 \text{ to } 3 \text{ for the 3 lower } MSB$$

$$I_{MSBi} = 1024 * I, \ i=1 \text{ to } 15 \text{ for the 15 upper } MSB$$

It is proposed that, using predefined training inputs and a digital feedback via the low bandwidth ADC circuit 152, it is possible to estimate current source mismatches.

A first 14-bit training code of "8194" is data decoded to produce the following 26-bit code: <00000001111111100000000010>.

Using the current equations above, the output current from the circuit 240 in response to this code is:

$$DAC \text{ Output } 1 = I_{out} + DAC \text{ Offset}$$

$$DAC \text{ Output } 1 = (\Sigma I_{Non\text{-}Ideal\ MSBi=1\ to\ 8} + I_{Non\text{-}Ideal\ LSBk=2}) - (\Sigma I_{Non\text{-}Ideal\ MSBi\ 9\ to\ 15} + \Sigma I_{Non\text{-}Ideal\ LMSBj=1\ to\ 3} + \Sigma I_{Non\text{-}Ideal\ LSBk=1,\ 3\ to\ 8}) + DAC \text{ Offset}$$

A second 14-bit training code of "8192" is data decoded to produce the following 26-bit code: <00000001111111100000000000>.

Using the current equations above, the output current from the circuit 240 in response to this code is:

$$DAC \text{ Output } 2 = I_{out} + DAC \text{ Offset}$$

$$DAC \text{ Output } 2 = (\Sigma I_{Non\text{-}Ideal\ MSBi=1\ to\ 8}) - (\Sigma I_{Non\text{-}Ideal\ MSBi=9\ to\ 15} + \Sigma I_{Non\text{-}Ideal\ LMSBj=1\ to\ 3} + \Sigma I_{Non\text{-}Ideal\ LSBk=2} + \Sigma I_{Non\text{-}Ideal\ LSBk=1,\ 3\ to\ 8}) + DAC \text{ Offset}$$

It will be noted that the difference between the two codes resides in the second to last bit (LSBk=2) from the right. It is this bit which changes logic state between the first and second training codes that isolates a particular one of the quad switch circuits 10.

DAC Output 1 and DAC Output 2 are sampled by the ADC circuit 150. The source mismatch estimator then takes the difference which is represented by the following:

$$= 2*(I_{Ideal\ LSBk=2} + \Delta I_{LSBk=2}) = 2*(2*I + \Delta I_{LSBk=2})$$

It will be noted from this equation that the result of the difference operation is dependent on the unit current value and the current source mismatch error attributable to only the isolated quad switch circuit 10 associated with LSB=2.

It is preferred to use a smallest possible current source for the quad switch circuits 10 in order to minimize parasitic effects. Such a device is further better compatible with high frequency performance. The current source may be sized at circuit design to have a minimally sufficient magnitude taking into account thermal noise and linear output impedance. The problems associated with current source mismatch when choosing smaller current sources are addressed by the calibration system described herein which implements a closed loop calibration block to compensate for static mismatch.

In an embodiment, the redundancy digital-to-analog converter should preferably at least run at double the clock rate to compensate for quad switch and current mode logic latch mismatch contribution.

The disclosed system provides for an effective calibration method for the purpose of calibrating as to static errors. The system further provides for improved temperature immunity due to the operation of the redundancy digital-to-analog converter. Because the solution also supports smaller current sources, the integrated circuit for the digital-to-analog converter will occupy a reduced about of chip real estate.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a plurality of current source cells coupled to an output and each configured to generate an output current in response to digital-to-analog conversion of digital data, a sum of said output currents producing an output voltage; and
   a calibration circuit comprising:
      a training code generator configured to generate first and second training codes for application to the plurality of current source cells as said digital data, the first and second training codes configured to isolate a selected one of the current source cells;
      an analog-to-digital converter configured to sample the output voltage in response to each of the first and second training codes and generate corresponding first and second digital voltage signals;
      a differencing circuit configured to determine a difference between the first and second digital voltage signals, said difference being indicative of mismatch in the selected one of the current source cells;
      an error code generator configured to generate a digital calibration signal in response to said difference and the digital data for digital-to-analog conversion by the plurality of current source cells; and a redundancy digital-to-analog converter configured to convert the digital calibration signal to an analog compensation signal for application to said output.

2. The circuit of claim 1, wherein each current source cell comprises:
a quad switch circuit; and
a control decode circuit operating responsive to a data bit of said digital data and a clock signal to control current steering within the quad switch circuit.

3. The circuit of claim 1, further comprising a multiplexor having a first input configured to receive a data input signal and a second input configured to receive the training codes, the multiplexor operating to selectively pass the data input signal to the plurality of current source cells in a conversion operating mode and selectively pass the training codes to the plurality of current source cells in a calibration operating mode.

4. The circuit of claim 3, further comprising a data decoder circuit coupled between an output of the multiplexor and the plurality of current source cells, said data decoder circuit configured to decode certain bits of the selectively passed data input signal or training codes to generate bits of the digital data.

5. The circuit of claim 1, wherein the error code generator performs both offset correction and gain rotation in generating the digital calibration signal.

6. A circuit, comprising:
an analog-to-digital converter configured to sense a voltage at an output of a digital-to-analog converter and generate a digital voltage signal;
a mismatch estimator configured to process the digital voltage signal to output an error signal indicative of mismatch within the digital-to-analog converter;
an error code generator configured to process the error signal and generate a digital calibration signal; and
a redundancy digital-to-analog converter configured to convert the digital calibration signal to an analog compensation signal for application to the output of said digital-to-analog converter to nullify effects of the mismatch.

7. The circuit of claim 6, wherein said digital-to-analog converter includes a plurality of current source cells each configured to generate an output current in response to received digital data.

8. The circuit of claim 7, wherein each current source cell comprises:
a quad switch circuit; and
a control decode circuit operating responsive to a data bit and a clock signal to control current steering within the quad switch circuit.

9. The circuit of claim 6, further comprising:
a training code generator configured to generate first and second training codes for application to and conversion by the digital-to-analog converter, the first and second training codes configured to isolate a particular source of current source mismatch.

10. The circuit of claim 9, wherein the analog-to-digital converter samples the output of the digital-to-analog converter in response to each of the first and second training codes and generates corresponding first and second digital signals, and wherein the mismatch estimator determines a difference between the digital signals to generate said error signal.

11. The circuit of claim 9, further comprising a multiplexor having a first input configured to receive a data input signal and a second input configured to receive the training codes, the multiplexor operating to selectively pass the data input signal to the digital-to-analog converter in a conversion operating mode and selectively pass the training codes to the digital-to-analog converter in a calibration operating mode.

12. The circuit of claim 11, further comprising a data decoder circuit coupled between an output of the multiplexor and the digital-to-analog converter, said data decoder circuit configured to decode certain bits of the selectively passed data input signal or training codes to generate bits applied to of the digital-to-analog converter for conversion.

13. The circuit of claim 6, wherein the error code generator performs both offset correction and gain rotation in generating the digital calibration signal.

14. A method, comprising:
generating an output current at each one of a plurality of current source cells coupled to an output in response to analog-to-digital conversion of digital data, a sum of said output currents producing a converted voltage; and
performing a calibration by:
generating first and second training codes for application to the plurality of current source cells as said digital data, the first and second training codes configured to isolate a selected one of the current source cells;
converting the output voltage in response to each of the first and second training codes to generate corresponding first and second digital voltage signals;
calculating a difference between the first and second digital voltage signals, said difference being indicative of mismatch in the selected one of the current source cells;
generating a digital calibration signal in response to said difference and the digital data for analog-to-digital conversion; and
converting the digital calibration signal to an analog compensation signal for application to said output.

15. The method of claim 14, further comprising multiplexing a data input signal and the training codes to selectively pass the data input signal to the plurality of current source cells in a conversion operating mode and selectively pass the training codes to the plurality of current source cells in a calibration operating mode.

16. The method of claim 15, further comprising decoding certain bits of the passed data input signal or training codes to generate bits of the digital data.

17. The method of claim 14, wherein generating the digital calibration signal comprises performing both offset correction and gain rotation.

18. A method, comprising:
sensing a voltage at an output of a digital-to-analog converter;
converting the sensed voltage to generate a digital voltage signal;
processing the digital voltage signal to generate an error signal indicative of current source mismatch within the digital-to-analog converter;
processing the error signal to generate a digital calibration signal;
converting the digital calibration signal to an analog compensation signal; and
applying the analog compensation signal to the output of said digital-to-analog converter to nullify effects of the current source mismatch.

19. The method of claim 18, further comprising generating first and second training codes for application to the digital-to-analog converter, the first and second training codes configured to isolate a particular source of current source mismatch.

20. The method of claim 19, wherein sensing the voltage comprises sensing a first voltage in response to conversion of the first training code and sensing a second voltage in response to conversion of the second training code and wherein converting the sensed voltage comprises generating corresponding first and second digital voltage signals.

21. The method of claim 20, wherein processing the digital voltage signal comprises determining a difference between the first and second digital voltage signals to generate said error signal.

22. The method of claim 19, further comprising multiplexing a data input signal and the training codes so as to selectively pass the data input signal to the digital-to-analog converter in a conversion operating mode and selectively pass the training codes to the digital-to-analog converter in a calibration operating mode.

23. The method of claim 22, further comprising decoding certain bits of the selectively passed data input signal or training codes to generate bits applied to of the digital-to-analog converter for conversion.

24. The method of claim 18, wherein processing the error signal comprises performing both offset correction and gain rotation in generating the digital calibration signal.

\* \* \* \* \*